United States Patent [19]
Apland et al.

[11] Patent Number: 5,828,538
[45] Date of Patent: Oct. 27, 1998

[54] POWER-UP CIRCUIT FOR FIELD PROGRAMMABLE GATE ARRAYS

[75] Inventors: James M. Apland, Gilroy; Andrew K. Chan, Palo Alto, both of Calif.

[73] Assignee: QuickLogic Corporation, Sunnyvale, Calif.

[21] Appl. No.: 775,984

[22] Filed: Jan. 3, 1997

Related U.S. Application Data

[63] Continuation-in-part of Ser. No. 667,702, Jun. 21, 1996.
[51] Int. Cl.$^6$ ........................................................ H02H 9/00
[52] U.S. Cl. ............................................... 361/56; 361/18
[58] Field of Search .................................. 361/18, 56, 78, 361/86, 88, 90–92, 110; 326/33, 39

[56] References Cited

U.S. PATENT DOCUMENTS

| | | | |
|---|---|---|---|
| 4,439,804 | 3/1984 | Riddle et al. | 361/92 |
| 5,196,724 | 3/1993 | Gordon et al. | 257/530 |
| 5,302,546 | 4/1994 | Gordon et al. | 437/170 |
| 5,336,986 | 8/1994 | Allman | 323/268 |
| 5,416,367 | 5/1995 | Chan et al. | 326/44 |
| 5,424,655 | 6/1995 | Chua | 326/40 |
| 5,495,181 | 2/1996 | Kolze | 326/38 |
| 5,502,315 | 3/1996 | Chua et al. | 257/50 |
| 5,544,070 | 8/1996 | Cox et al. | 364/489 |
| 5,557,136 | 9/1996 | Gordon et al. | 257/530 |

OTHER PUBLICATIONS

S. Trimberger, "Field Programmable Gate Array Technology", pp. 1–14 and 98–170 (1994) no month.

S. Brown et al., "Field Programmable Gate Arrays", pp. 1–43 and 88–202 (1992) no month.

D. Pellerin and M. Holley, "Practical Design Using Programmable Logic" pp. 84–98 (1991) no month.

Advanced Micro Devices, PAL Device Data Book and Design Guide, pp. 2–236 through 2–247 (1993).

Quicklogic Data Book, pp. 1–5 through 2–11 and 6–3 through 6–18, (1995) no month.

Actel FPGA Data Book and Design Guide, pp. ix–xv, 1–5 through 1–34, 1–51 through 1–101, 1–153 through 1–222, 3–1 through 4–56 (1995) May.

Xilinx, "The Programmable Gate Array Design Book", First Edition, pp. 1–9 thru 2–73 (1986) no month.

*Primary Examiner*—Ronald W. Leja
*Attorney, Agent, or Firm*—Skjerven, Morrill, MacPherson, Franklin and Friel; T. Lester Wallace

[57] ABSTRACT

A protection circuit prevents a current spike in a logic module in a field programmable gate array during power up of the gate array. The protection circuit supplies a voltage onto an internal disable input of the logic module during power up until a voltage output by a charge pump reaches a predetermined voltage. The voltage on the internal disable input turns off transistor(s) in the logic module and prevents the current spike. When the voltage output by the charge pump reaches the predetermined voltage, the protection circuit no longer supplies the voltage to the logic module's internal disable input.

16 Claims, 5 Drawing Sheets

POWER-UP CIRCUIT FOR FIELD PROGRAMMABLE GATE ARRAYS

CROSS-REFERENCE TO RELATED APPLICATION

This application is a continuation-in-part of U.S. application Ser. No. 08/667,702, filed Jun. 21, 1996.

FIELD OF THE INVENTION

The present invention relates to application specific integrated circuits, and more particularly to field programmable gate arrays, and even more particularly to a circuit for preventing current spikes during power up of a field programmable gate array.

BACKGROUND INFORMATION

A field programmable gate array (FPGA) is a versatile integrated circuit chip, the internal circuitry of which may be configured before packaging by a manufacturer or after packaging by an individual user to realize a user-specific circuit. To configure an FPGA, the user typically configures an on-chip interconnect structure of the FPGA so that selected circuit components in logic modules of the FPGA are electrically connected together in such a way that the resulting circuit is the user-specific circuit desired by the user. In an FPGA employing, for example, amorphous silicon antifuses, selected amorphous silicon antifuses electrically disposed between selected routing conductors in the interconnect structure are "programmed" to connect the selected routing conductors together electrically. Which antifuses are programmed and which antifuses are left unprogrammed determines how the circuit components of the numerous logic modules are interconnected and therefore determines the resulting circuit. FPGAs can employ other types of antifuse structures including, for example, antifuses employing nitrides and oxides. For further details on FPGAs and antifuses, see U.S. Pat. Nos. 5,557,136, 5,544,070, and 5,220,213 all of which are incorporated herein in their entirety.

Figure 1:
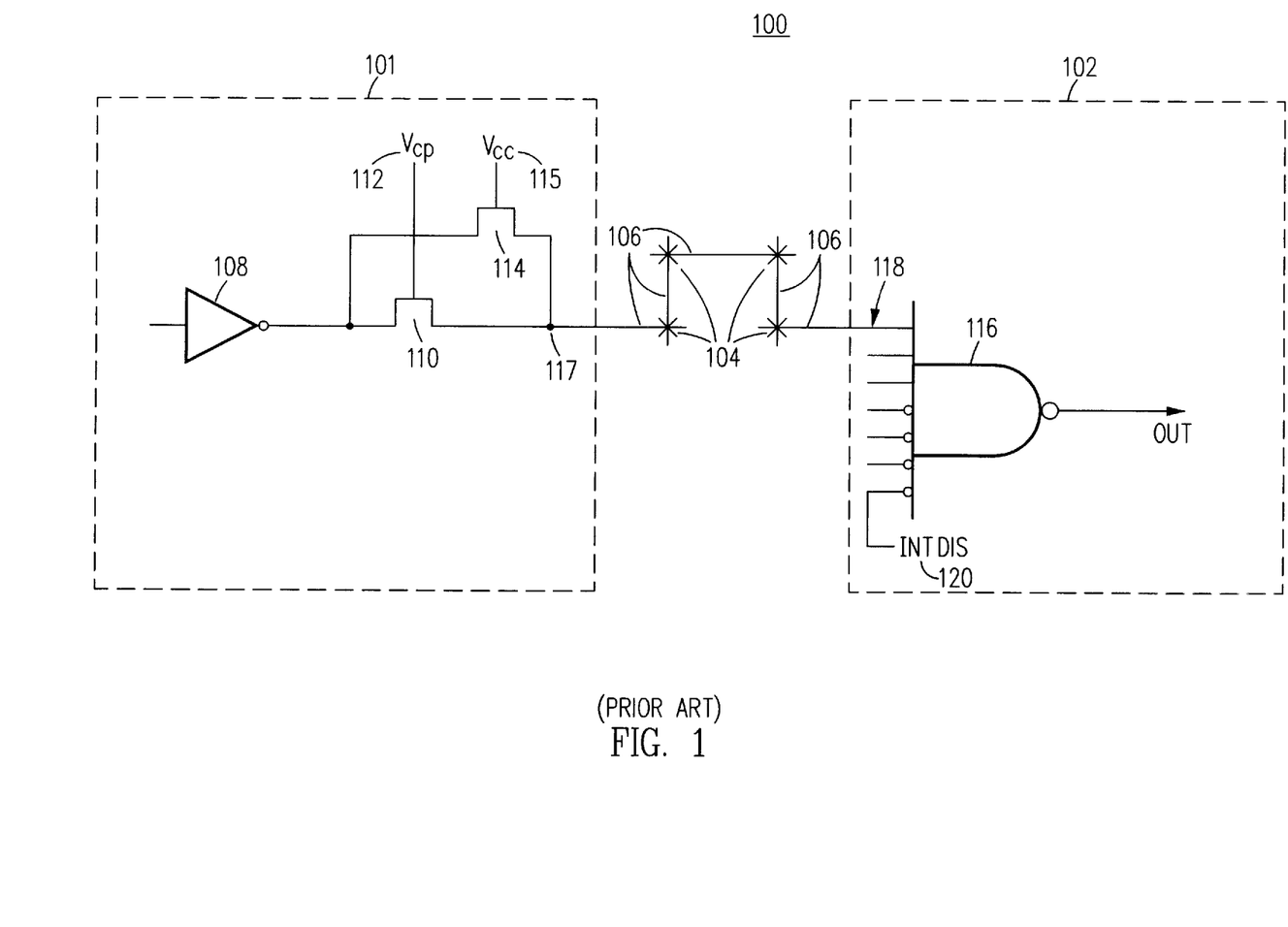
FIG. 1 (Prior Art) shows a portion of a field programmable gate array having logic modules connected by antifuses and routing conductors.

FIG. 1 (Prior Art) is a simplified illustration of a first logic module 101, an output of which is connected to an input of a second logic module 102 by programmed antifuses 104 and routing conductors 106 of the interconnect structure. Logic module 102 includes a NAND gate 116 shown in detail in FIG. 2 (Prior Art). The seven inputs of NAND gate 116 are labeled 1–7. Transistors 110 and 114 are high voltage protection transistors provided to prevent high voltages present on the interconnect structure during antifuse programming from damaging the logic transistors of the circuit 108 (in this case an inverter) of the logic module output. Protection transistors 110 and 114 are nonconductive during antifuse programming and are conductive during normal circuit operation.

Figure 3:
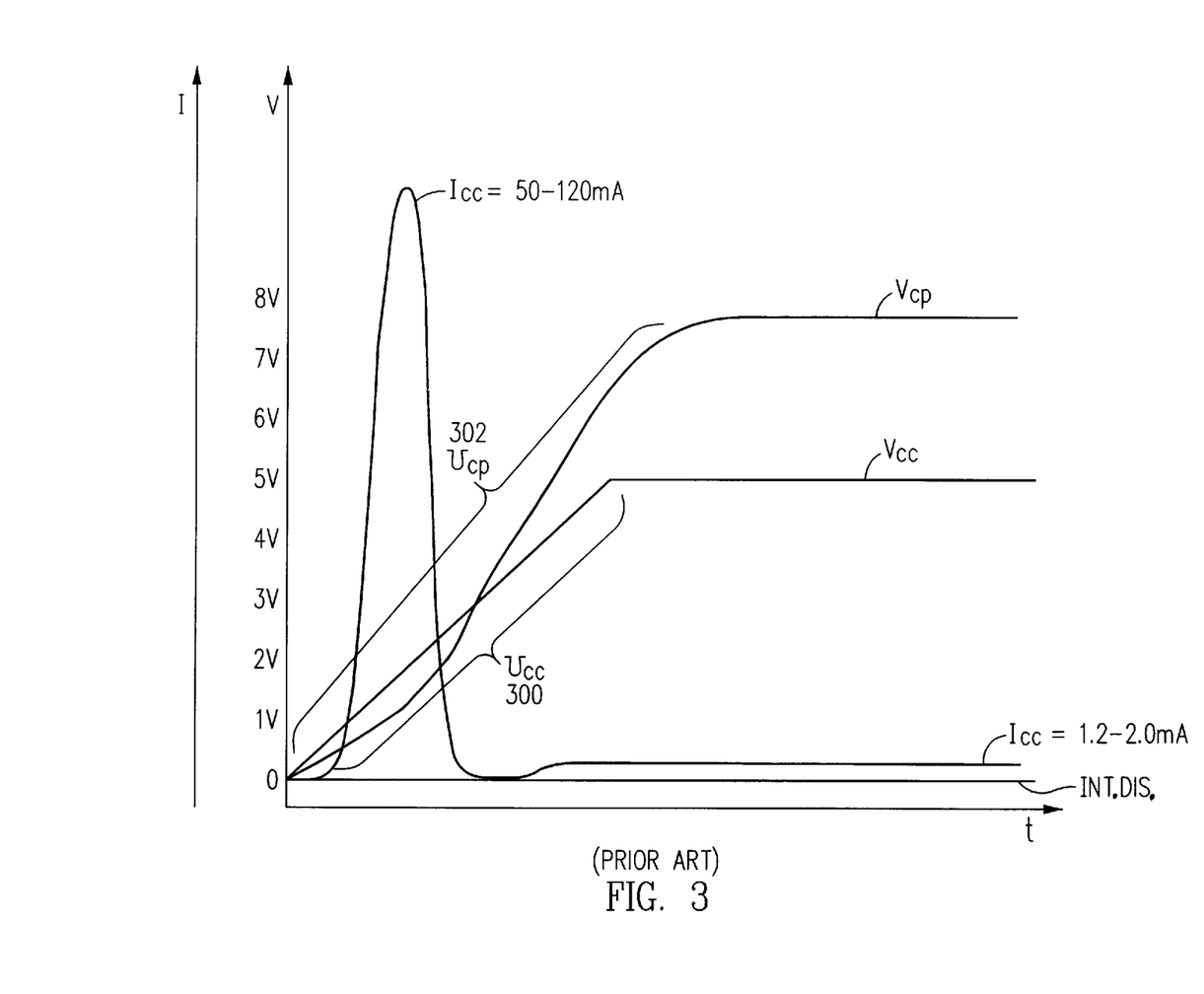
FIG. 3 (Prior Art) is a waveform diagram of the $V_{CC}$ and the $V_{CP}$ voltages and the $I_{CC}$ current spike that occurs during power up of the field programmable gate array.

During power up of the FPGA during normal circuit operation (after the FPGA has been programmed and when it is being used by the user), outputs of logic modules which are to supply digital logic HIGHs during the power up period may actually only supply an intermediate voltage. FIG. 3 is a waveform diagram showing the supply voltage $V_{CC}$ 115 increasing during the power up period. Supply voltage $V_{CC}$ is supplied to the gate of protection transistor 115 so that protection transistor 115 will be conductive during normal operation so that the output of inverter 108 will be coupled to input 118 of NAND gate 116.

Figure 2:
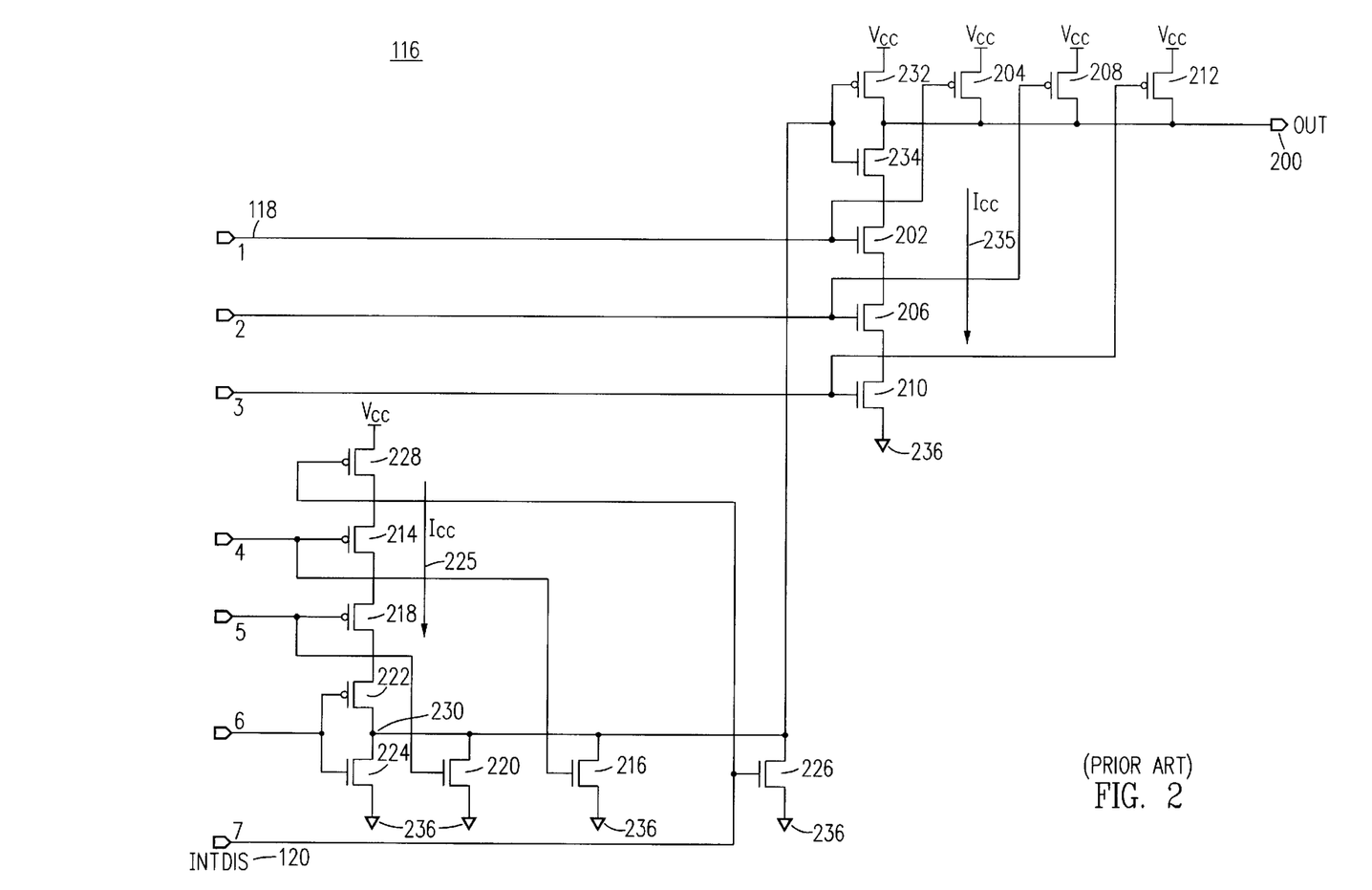
FIG. 2 (Prior Art) is a transistor level diagram of a NAND gate that is part of the logic modules shown in FIG. 1.

A threshold voltage drop however exists across transistor 114. If inverter 108 outputs a voltage $V_{CC}$, node 117 would only be driven to $V_{CC}$ minus the threshold voltage $V_{THPT}$ of protection transistor 114 (for example, 1.2 volts) due to this threshold voltage drop were it not for the effect of protection transistor 110. The gate of protection transistor 110 is supplied with a greater charge pump voltage $V_{CP}$ (for example, 7.8 volts) such that a threshold voltage drop (for example, 1.2 volts) does not occur across transistor 110 during normal circuit operation. Protection transistor 110 therefore conducts the necessary current from the output of inverter 108 to drive input 118 the rest of the way up to $V_{CC}$.

Until the voltages $V_{CC}$ and $V_{CP}$ reach their appropriate levels (for example, 5.0 volts and 7.8 volts, respectively), however, intermediate voltages are present on those logic module inputs that are to be driven during this power up period with digital logic HIGHs. If, for example, input 7 (see FIG. 2) is at a digital logic LOW and inputs 4–6 are at an intermediate voltage insufficient to turn pmos transistors 214, 218 and 222 completely off, then a current $I_{CC}$ 225 will flow from supply voltage $V_{CC}$, through transistor 228, 214, 218, 222 and 226. Because there are many thousands of these current paths due to the many logic modules in an FPGA, the cumulative total current $I_{CC}$ may be undesirably large and could be beyond a supply current maximum specified for the device.

FIG. 3 (Prior Art) shows the current spike $I_{CC}$ that occurs during power up. In the event the FPGA is being powered from a battery, the battery may not be able to supply the large spike of power up current causing the supply voltage $V_{CC}$ to drop undesirably low during power up.

A method and circuit are desired to prevent such current spikes during power up.

SUMMARY

A protection circuit prevents a current spike in a logic module in a field programmable gate array during power up of the gate array. The protection circuit supplies a voltage onto an internal disable input of the logic module during the power up. This voltage turns off transistor(s) in the logic module and prevents the current spike. When power up is completed, the protection circuit no longer supplies the voltage to the logic module's internal disable input.

In some embodiments, a node NA of the protection circuit has a voltage which is initially low and which increases as the voltage $V_{CP}$ output by a charge pump increases. When the voltage on node NA is below a switching threshold voltage, the protection circuit supplies a first digital logic level (for example, tracks the supply voltage $V_{CC}$ as $V_{CC}$ rises) onto the internal disable input. The first digital logic level turns off transistor(s) in the logic module and prevents the current spike. When the voltage on node NA reaches the switching threshold voltage (corresponding with the supply voltage $V_{CC}$ and the charge pump voltage $V_{CP}$ having voltages of sufficient magnitudes such that the current spike will not occur if the first digital logic level is removed), the protection circuit supplies a second digital logic level (for example, ground potential) onto the internal disable input.

The present invention is better understood upon consideration of the detailed description below, in conjunction with the accompanying drawings. As will become readily apparent from the following description, there is shown and described a preferred embodiment of this invention simply by way of illustration of the mode best suited to carry out the invention. As it will be realized, the invention is capable of other different embodiments, and its several details are capable of modifications in various, obvious aspects all without departing from the scope of the invention.

Accordingly, the drawings and descriptions will be regarded as illustrative in nature and not as restrictive.

BRIEF DESCRIPTION OF THE DRAWINGS

The accompanying drawings incorporated in and forming a part of the specification, illustrate the present invention, and together with the description serve to explain the principles of the invention. In the drawings.

DETAILED DESCRIPTION

FIG. 1 is an illustration of a portion of a prior art device 100 showing a first logic module 101 and a second logic module 102 that have been interconnected by programmed antifuses 104 and routing conductors 106. Details of such a prior art device can be found in U.S. patent application Ser. No. 08/667,702, which is incorporated herein in its entirety. Details of antifuses can be found in U.S. Pat. Nos. 5,302, 546, 5,294,846, and 5,243,226 all of which are incorporated herein in their entirety. The output of logic module 101 includes inverter 108, protection transistor 110 that has a gate connected to a voltage generated by a charge pump, $V_{CP}$ 112, and protection transistor 114 that has a gate connected to the supply voltage, $V_{CC}$ 115.

The logic module 102 includes a NAND gate 116 having seven inputs (three are noninverting and four are inverting). Each of the top six inputs can be selectively connected to logic modules via the interconnect structure. One of the inputs to the NAND gate 116 is an internal disable input INTDIS 120 that is used in the prior art to disable the NAND gate 116 during testing of the device. NAND gate 116 is disabled by supplying a digital logic HIGH to the internal disable input INTDIS 120. During power up, the internal disable input INTDIS 120 is supplied with a digital logic LOW in the prior art device.

FIG. 2 is a transistor level diagram of NAND gate 116 showing the seven inputs which have been numbered from 1 to 7 and the NAND gate output 200. As discussed in conjunction with FIG. 1, each of the six inputs 1 through 6 can be connected to other logic modules (such as logic module 101) via the interconnect structure. The seventh input 7 (also labeled 120) is the internal disable input INTDIS. The input 1 is connected to the gate of the nmos transistor 202 and to the gate of the pmos transistor 204. The input 2 is connected to the gate of the nmos transistor 206 and to the gate of the pmos transistor 208. The input 3 is connected to the gate of the nmos transistor 210 and to the gate of the pmos transistor 212. The input 4 is connected to the gate of the pmos transistor 214 and to the gate of the nmos transistor 216. The input 5 is connected to the gate of the pmos transistor 218 and to the gate of the nmos transistor 220. The input 6 is connected to the gate of the pmos transistor 222 and to the gate of the nmos transistor 224. The input 7 which is the INTDIS 120 is connected to the gate of the nmos transistor 226 and to the gate of the pmos transistor 228. The drain of pmos transistor 222 and the drains of nmos transistors 224, 220, 216 and 226 form an output node 230. Node 230 is connected to the gates of pmos transistor 232 and nmos transistor 234.

As can be appreciated, the transistors 228, 214, 218, and 222 provide a path for a current $I_{CC}$, indicated at 225, from the supply voltage $V_{CC}$ to common ground 236 if all of the transistors 228, 214, 218 and 222 are ON or partially ON when at least one of nmos transistors 224, 220, 216 and 226 is ON or partially ON. Similarly, the transistors 234, 202, 206, and 210 provide a path from the supply voltage $V_{CC}$ for a current $I_{CC}$, indicated at 235, to common ground 236 if all of the transistors 234, 202, 206, and 210 are ON or partially ON when at least one of the pmos transistors 232, 204, 208, and 212 is ON or partially ON.

Referring again to FIG. 1, when the prior art device 100 has power applied to it, the voltage sources $V_{CP}$ and $V_{CC}$ begin to increase from zero as shown in FIG. 3. The instantaneous voltage from the supply voltage $V_{CC}$ is represented by $v_{CC}$ and the instantaneous voltage from the charge pump is represented by $v_{CP}$. The threshold voltage of protection transistors 114 and 110 is represented by $V_{THPT}$ (for example, 1.2 volts). The threshold voltage of the logic transistors in NAND gate 116 is represented by $V_{THLT}$ (for example, 0.7 volts).

FIG. 3 shows the relationship between the instantaneous voltage $v_{CC}$ shown at 300 and the instantaneous voltage $v_{CP}$ shown at 302. Because the instantaneous voltage $v_{CP}$ is less than $v_{CC}$ during the initial power up phase as shown in FIG. 3, the voltage at node 117 is initially approximately ($v_{CC}$ − $V_{THPT}$). Due to the interconnect structure, the voltage at node 117 is also present on the input 118 of NAND gate 116. Because the voltage at node 117 is at an intermediate state (that is, the voltage $v_{CC}$ − $V_{THPT}$ at node 117 is not sufficiently high to turn a pmos transistor OFF but is sufficiently high to turn an nmos transistor ON), the nmos transistor of any logic module input connected to a node such as node 117 would be either ON or partially ON.

If, for example, input INTDIS 120 is low, then the nmos transistor 226 is OFF and the pmos transistor 228 is ON. If the voltages on inputs 4–6 were driven with intermediate voltages during this period, then $I_{CC}$ current 225 would flow from supply voltage $V_{CC}$, through transistors 214, 218 and 222 and through transistors 224, 220 and 216 to common ground. Node 230 may also be at an intermediate voltage due to the voltage divider effect of the partially on pmos and nmos transistors between $V_{CC}$ and common ground. In addition, if inputs 1–3 were driven with intermediate voltages during this period, then $I_{CC}$ current 235 would flow through transistors 232, 204, 208 and 212 and through transistors 234, 202, 206 and 210 to common ground.

FIG. 3 indicates graphically the current spike that occurs during the power up of a prior art field programmable gate array. Although the currents flowing through individual transistors that are partially ON during power up are small, on the order of tenths of milliamperes, because there are thousands of such transistors, the collective current is significant and as shown in FIG. 3 the magnitude can be on the order of 50–120 mA. When the charge pump voltage $v_{CP}$ exceeds $v_{CC}$ adequately, protection transistor 110 conducts current from inverter 108 to pull the voltage on node 117 the rest of the way up to $v_{CC}$ and the $I_{CC}$ current spikes 225 and 235 stop.

Figure 4:
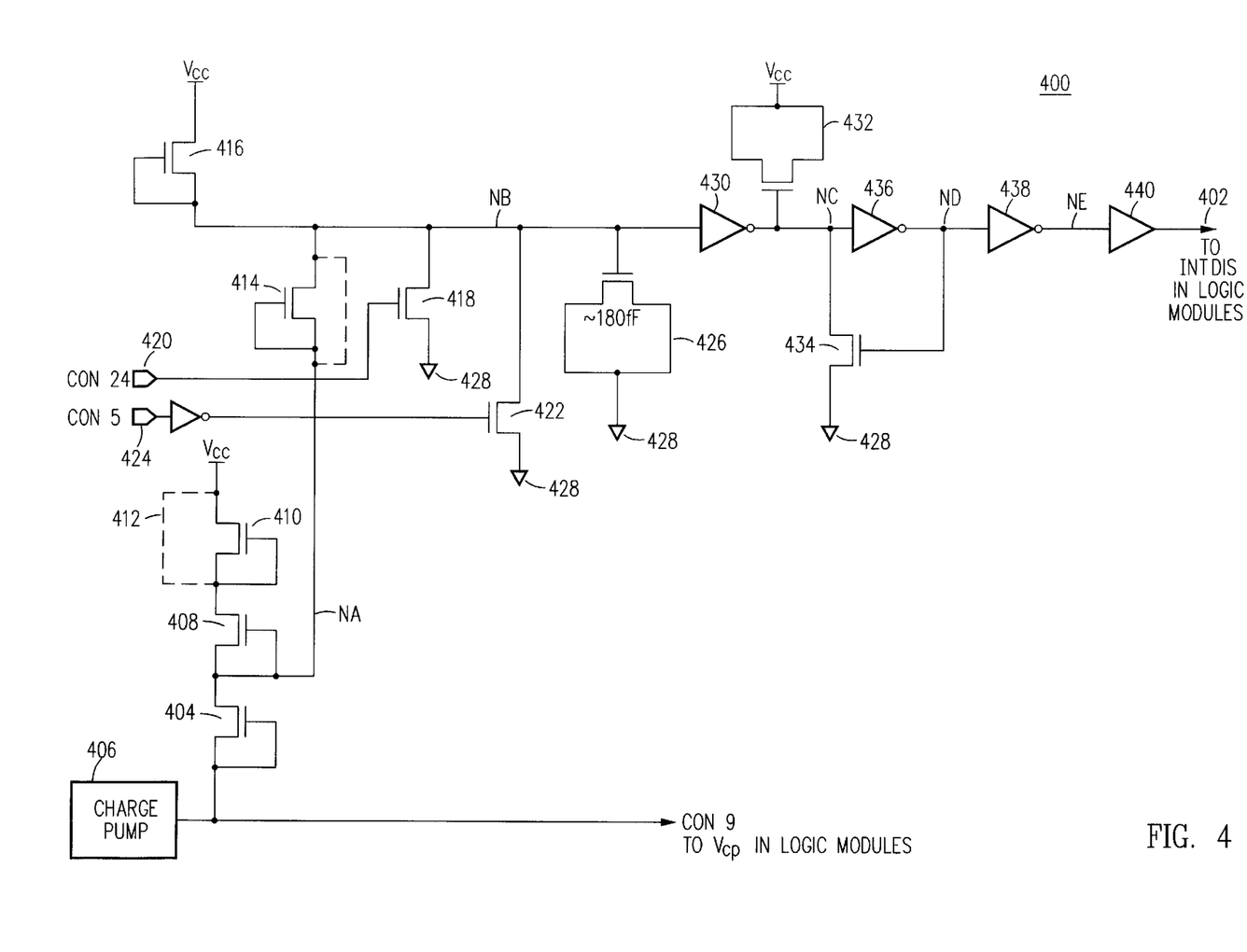
FIG. 4 is a simplified schematic of a protection circuit in accordance with an embodiment of the present invention.

FIG. 4 is a simplified schematic diagram of a protection circuit 400 in accordance with the present invention that prevents the $I_{CC}$ current spike of the prior art. Output 402 of circuit 400 is coupled to the input INTDIS 120 (FIG. 2) of NAND gate 116 of all logic modules in the FPGA. Circuit 400 causes a digital HIGH voltage (in one embodiment, a voltage that tracks $v_{CC}$) to be supplied onto the input INTDIS 120 during the power up period when the prior art current spike would have occurred.

$V_{CPINTLO}$ is the lowest possible voltage output by the charge pump when the internal disable signal INDIS goes LOW. The charge pump's output voltage $v_{CP}$ rising above $v_{CC}$ is what allows the voltage on node 117 to rise up to $v_{CC}$. Accordingly, $V_{CPINTLO}$ must be at least $(v_{CC}-V_{THLT})+V_{THPT}$. After this power up period and once $v_{CP}$ is adequately high, circuit 400 allows the input INTDIS 120 to be driven with a digital logic LOW for normal circuit operation.

Referring to FIG. 2, the instantaneous voltage $v_{CC}$ is supplied to the gate of the pmos transistor 228 which makes pmos transistor 228 nonconductive. With the transistor 228 nonconductive, current 225 cannot flow. Because the instantaneous voltage $v_{CC}$ is also supplied to the gate of the nmos transistor 226, nmos transistor 226 is ON, the drain of transistor 226 pulls node 230 LOW, and nmos transistor 234 is nonconductive. Transistor 234 being nonconductive prevents the flow of current 235.

Referring again to FIG. 4, circuit 400 includes an nmos transistor 404 connected between an output of the charge pump 406 and node NA. Nmos transistor 408 is connected between node NA and nmos transistor 410. The nmos transistor 410 is shortable, indicated by the dashed line 412, and is shorted out of the circuit in the 5 volt mask option which clamps the voltage at node NA to one threshold voltage above $V_{CC}$. With the transistor 410 in the circuit for 3 volt operation, the voltage at node NA is clamped to two threshold voltages above $V_{CC}$. Node NA is connected to node NB via a transistor 414. Transistor 414 is shortable and is shorted for 3 volts operation. With the transistor 414 in the circuit, the voltage at node NB is clamped at $V_{CC}+V_{THLT}$ (also the output of the charge pump minus the two threshold voltages of transistors 404 and 414). Transistor 416 is connected as a diode to couple node NB to $V_{CC}$ and to clamp node NB to not more than one threshold drop above $V_{CC}$.

Transistor 418 is provided to test circuit 400. To test the power up circuit 400, input terminal "Con24" 420 is pulsed HIGH when the charge pump 406 is on after the power up period has elapsed. When transistor 418 pulses ON, node NB pulses LOW, inverter 430 outputs a digital logic HIGH pulse, inverter 436 outputs a digital logic LOW pulse, inverter 438 outputs a digital logic HIGH pulse, and buffer 440 outputs a digital logic HIGH pulse. If output 402 does not pulse HIGH, circuit 400 is determined to have failed.

Transistor 422 is controlled by an input from an input terminal "Con5" 424. A digital logic LOW may be placed on terminal 424 to disable circuit 400 in some test modes. Capacitor 426 is connected between node NB and common ground at 428 and functions to maintain node NB at zero volts initially at power up and further functions to retard the voltage increase of node NB. Capacitor 432 is connected between $V_{CC}$ and node NC and functions to couple node NC to $v_{CC}$ initially at very low voltages below $V_{THLT}$. Transistor 434, inverter 436, and inverter 438 form a buffer circuit with hysteresis to prevent oscillation on node NE. Buffer 440 is gated with other signals and operates as a buffer during normal circuit operation.

Figure 5:
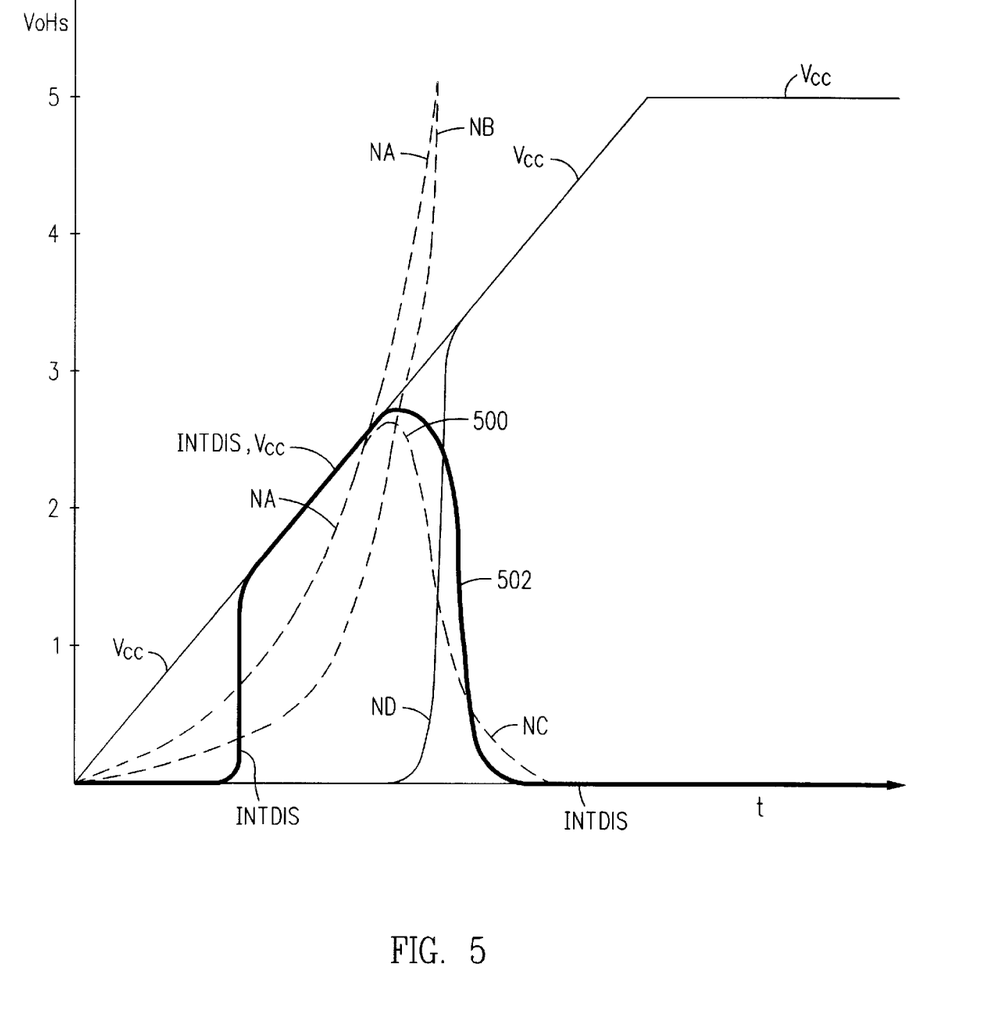
FIG. 5 is a simplified waveform diagram of voltages at selected nodes of the protection circuit shown in FIG. 4.

FIG. 5 is a simplified waveform diagram of the voltage $V_{CC}$, the voltage at INTDIS, and the voltages at the nodes NA, NB, NC, and ND. The current spike during power up can be prevented if a voltage equal to the instantaneous $v_{CC}$ is applied to the INTDIS input 120 of the NAND gate 116 (FIGS. 1 and 2) during the power up period when intermediate voltages could be present on logic modules inputs.

Referring to FIGS. 4 and 5, during power up the voltage at node NA begins to increase and is one threshold voltage below the voltage at the output of the charge pump. The voltage on node NB begins to increase and as discussed above is retarded by capacitor 426. In addition, as discussed above, the voltage on node NB is at least one threshold voltage below the voltage on node NA due to transistor 414. The voltage on node NC is initially determined by capacitor 432 and tracks the instantaneous voltage $v_{CC}$ due to capacitive coupling. Inverters 436 and 438 operate to drive the voltage at INTDIS 402 to $v_{CC}$ which is rising. When the rising voltage on node NB reaches the threshold switching voltage of inverter 430 (which is designed to be approximately $V_{CC}-V_{THLT}$), inverter 430 begins to switch the voltage on node NC LOW as indicated at 500 (FIG. 5). At this instant, the charge pump's output voltage ("Con9") is approximately $2V_{THPT}+V_{CC}-V_{THLT}$ (which is about $V_{THPT}$ higher than $V_{CC}$). This charge pump voltage prevents intermediate voltage levels at the inputs of the logic cells. The voltage at INTDIS 402 remains HIGH (tracking $v_{CC}$) until inverter 430 completes the switching node NC to a LOW at which time the voltage on input INTDIS switches LOW, indicated at 502. When the voltage on input INTDIS switches LOW, the power up function of the circuit 400 is complete and circuit 400 operates in the normal mode. In this embodiment, signal INTDIS transitions LOW even before $v_{CC}$ reaches steady state at $V_{CC}$.

The foregoing description of the preferred embodiment of the invention has been presented for purposes of illustration and description. It is not intended to be exhaustive or to limit the invention to the precise form disclosed. Modifications or variations are possible in light of the above teachings. The embodiment was chosen and described to provide the best illustration of the principles of the invention and its practical application to thereby enable one to utilize the invention in various embodiments and with various modifications which are suited to the particular use contemplated. All such modifications and variations are within the scope of the invention as defined by the claims.

What is claimed is:

1. A protection circuit for preventing a current spike in a logic module having an internal disable input during power up of a field programmable gate array, the protection circuit comprising means for providing a voltage input to the internal disable input to disable the logic module until a voltage output by a charge pump of the field programmable gate array reaches a predetermined voltage, the voltage input to the internal disable input being substantially equal to an instantaneous supply voltage being applied to the protection circuit, the means for providing comprising:

means for providing an increasing voltage proportional to the voltage output by the charge pump to the protection circuit at a first node of the protection circuit during power up;

means for retarding the voltage increase at the first node of the protection circuit during power up;

means for providing a voltage at a second node substantially equal to the instantaneous supply voltage being applied to the protection circuit during power up; and means for switching the voltage input to the internal disable input from a digital logic high to a digital logic low.

2. The protection circuit of claim 1, wherein the means for switching the voltage input to the internal disable input comprises a first inverter disposed between the first node and the second node, wherein the inverter switches when the voltage at the first node reaches the switching threshold voltage of the first inverter.

3. The protection circuit of claim 2, further comprising means for communicating the voltage at the second node to the internal disable input.

4. The protection circuit of claim 3, wherein the means for communicating the voltage at the second node to the internal disable input comprises a buffer circuit with hysteresis.

5. The protection circuit of claim 4, wherein the means for communicating the voltage at the second node to the internal disable input further comprises a buffer.

6. The protection circuit of claim 5, wherein the buffer circuit with hysteresis comprises a second and third inverter disposed between the second node and the buffer and a transistor disposed between the second node and ground with a gate connected to a third node between the second and third inverter.

7. A method of preventing a current spike in a logic module having an internal disable input during power up of a field programmable gate array, the method comprising:

inputting a voltage to the internal disable input to disable the logic module until a voltage output by a charge pump of the field programmable gate array reaches a predetermined voltage, wherein the voltage input to the internal disable input is substantially equal to an instantaneous voltage being applied to the logic module;

providing an increasing voltage proportional to the voltage output by the charge pump to an input of a first inverter;

retarding the increasing voltage at the input of the first inverter;

providing a voltage at the output of the first inverter which is substantially equal to an instantaneous supply voltage being applied to the logic module during power up; and switching the voltage input to the internal disable input from a digital logic high to a digital logic low.

8. The method of claim 7, further comprising communicating the voltage at the output of the first inverter to the internal disable input.

9. A field programmable gate array, comprising:

an interconnect structure comprising routing conductors;

a plurality of logic modules, each of the logic modules having an input logic element, the input logic element having a plurality of inputs which when the field programmable gate array is unconfigured are not coupled to an output of any logic module, the input logic element also having an internal disable input; and a protection circuit having an output coupled to the internal disable inputs of the logic modules and supplying a first voltage signal onto the internal disable inputs during a first power up period and supplying a second voltage signal onto the internal disable inputs during a second power up period, the second power up period starting before a supply voltage $V_{CC}$ of the field programmable gate array reaches steady state.

10. A field programmable gate array, comprising:

an interconnect structure comprising routing conductors;

a plurality of logic modules, each of the logic modules having an input logic element, the input logic element having a plurality of inputs which when the field programmable gate array is unconfigured are not coupled to an output of any logic module, the input logic element also having an internal disable input;

a protection circuit having an output coupled to the internal disable inputs of the logic modules and supplying a first voltage signal onto the internal disable inputs during a first power up period and supplying a second voltage signal onto the internal disable inputs during a second power up period, the second power up period starting before a supply voltage $V_{CC}$ of the field programmable gate array reaches steady state; and a charge pump, the second power up period starting when a voltage output by the charge pump reaches a predetermined voltage.

11. A field programmable gate array, comprising:

an interconnect structure comprising routing conductors;

a plurality of logic modules, each of the logic modules having an input logic element, the input logic element having a plurality of inputs which when the field programmable gate array is unconfigured are not coupled to an output of any logic module, the input logic element also having an internal disable input; and a protection circuit having an output coupled to the internal disable inputs of the logic modules and supplying a first voltage signal onto the internal disable inputs during a first power up period and supplying a second voltage signal onto the internal disable inputs during a second power up period, the second power up period starting before a supply voltage $V_{CC}$ of the field programmable gate array reaches steady state, wherein the first voltage signal has a magnitude which increases as the supply voltage $V_{CC}$ increases and wherein the second voltage signal is ground potential.

12. A field programmable gate array, comprising:

an interconnect structure comprising routing conductors;

a plurality of logic modules, each of the logic modules having an input logic element, the input logic element having a plurality of inputs which when the field programmable gate array is unconfigured are not coupled to an output of any logic module, the input logic element also having an internal disable input; and a protection circuit having an output coupled to the internal disable inputs of the logic modules and supplying a first voltage signal onto the internal disable inputs during a first power up period and supplying a second voltage signal onto the internal disable inputs during a second power up period, the second power up period starting before a supply voltage $V_{CC}$ of the field programmable gate array reaches steady state, wherein the interconnect structure comprises antifuses.

13. The field programmable gate array of claim 12, further comprising:

a charge pump having an output, wherein each logic module has outputs, each logic module output comprising a protection transistor having a gate, the gate of each protection transistor being coupled to the output of the charge pump.

14. The field programmable gate array of claim 13, wherein the protection transistors are made nonconductive during antifuse programming.

15. A field programmable gate array, comprising a plurality of logic cells, an interconnect structure, a charge pump, and a protection circuit, the protection circuit outputting a first voltage signal to each of the logic cells during a power up period until a voltage output by the charge pump reaches a predetermined voltage, the protection circuit outputting a second voltage signal to each of the logic cells after the voltage output by the charge pump reaches the predetermined voltage.

16. The field programmable gate array of claim 15, wherein the first voltage signal is substantially equal to a supply voltage supplied to the field programmable gate array, and wherein the second voltage signal is substantially equal to ground potential supplied to the field programmable gate array.

* * * * *